US012770943B2

(12) United States Patent
Sherstyuk et al.

(10) Patent No.: US 12,770,943 B2
(45) Date of Patent: Oct. 20, 2026

(54) METHODS AND SYSTEMS FOR TEMPERATURE-BASED BATTERY CHARGING

(71) Applicant: Gbatteries Energy Canada Inc., Ottawa (CA)

(72) Inventors: Mykola Sherstyuk, Ottawa (CA); Oleksandr Tkachenko, Ottawa (CA)

(73) Assignee: Gbatteries Energy Canada Inc., Ottawa (CA)

(*) Notice: Subject to any disclaimer, the term of this patent is extended or adjusted under 35 U.S.C. 154(b) by 714 days.

(21) Appl. No.: 18/039,258

(22) PCT Filed: Dec. 14, 2021

(86) PCT No.: PCT/CA2021/051800
§ 371 (c)(1),
(2) Date: May 29, 2023

(87) PCT Pub. No.: WO2022/126254
PCT Pub. Date: Jun. 23, 2022

(65) Prior Publication Data

US 2024/0006673 A1 Jan. 4, 2024

Related U.S. Application Data

(60) Provisional application No. 63/126,097, filed on Dec. 16, 2020.

(51) Int. Cl.
*G01R 31/374* (2019.01)
*H01M 10/42* (2006.01)
(Continued)

(52) U.S. Cl.
CPC ........ *H01M 10/443* (2013.01); *G01R 31/374* (2019.01); *H01M 10/425* (2013.01); *H01M 10/486* (2013.01); *H01M 2010/4271* (2013.01)

(58) Field of Classification Search
CPC ........ G01R 31/374; H02J 7/875; H02J 7/927; H02J 7/977
See application file for complete search history.

(56) References Cited

U.S. PATENT DOCUMENTS

2002/0070710 A1* 6/2002 Yagi ........................ B60L 50/60 320/150
2005/0017692 A1 1/2005 Izumi et al.
(Continued)

FOREIGN PATENT DOCUMENTS

CN 102479983 A 5/2012
CN 103825060 A 5/2014
(Continued)

OTHER PUBLICATIONS

International Search Report for related application PCT/CA2021/051800 issued Feb. 24, 2022.
(Continued)

*Primary Examiner* — Julian D Huffman
*Assistant Examiner* — Sadia Kousar

(57) ABSTRACT

Disclosed are methods, systems, and devices for charging a battery pack based on a temperature of the battery pack. The temperature of the battery pack is determined and compared with a reference temperature value. In response to determining that the temperature of the battery pack is less than the reference temperature value, heating-optimized pulses, having a first frequency, are applied to the battery pack. The heating-optimized pulses comprise a sequence of alternating positive and negative pulses, and carry a net positive charge. Concurrent to applying the heating-optimized pulses to the battery pack, the temperature of the battery pack is determined. In response to determining that the temperature of the battery pack is more than the reference temperature value, charging current is applied to the battery pack.

16 Claims, 10 Drawing Sheets

(51) Int. Cl.
*H01M 10/44* (2006.01)
*H01M 10/48* (2006.01)

(56) References Cited

U.S. PATENT DOCUMENTS

| | | | | |
|---|---|---|---|---|
| 2009/0251103 | A1 | 10/2009 | Yamamoto et al. | |
| 2010/0164437 | A1 | 7/2010 | McLinley et al. | |
| 2012/0025773 | A1 | 2/2012 | Wang et al. | |
| 2016/0152151 | A1 | 6/2016 | Yang et al. | |
| 2019/0140457 | A1 | 5/2019 | Dong et al. | |
| 2020/0119410 | A1 | 4/2020 | Tian | |
| 2020/0381784 | A1 | 12/2020 | Yamamoto et al. | |
| 2022/0263144 | A1* | 8/2022 | Xie | H01M 10/443 |

FOREIGN PATENT DOCUMENTS

| | | | |
|---|---|---|---|
| CN | 110783655 | A | 2/2020 |
| DE | 10201707853 | A1 | 10/2018 |
| JP | 2006092901 | A | 4/2006 |

OTHER PUBLICATIONS

Yu et al., "Experimental Studies of Charging Strategy for Lithium-Ion Batteries", SAE Technical Paper, No. 2019-01-0792, pp. 1-8.

* cited by examiner

METHODS AND SYSTEMS FOR TEMPERATURE-BASED BATTERY CHARGING

CROSS REFERENCE TO RELATED APPLICATIONS

This application claims priority to U.S. Provisional Patent Application No. 63,126,097, filed on Dec. 16, 2020, the content of which is incorporated herein by reference in its entirety for all purposes.

TECHNICAL FIELD

The present specification relates to battery charging, and in particular to temperature-based battery charging methods and systems.

BACKGROUND

Advancements in battery technology have not kept up with market demand. There is a need to improve performance of battery systems. In particular, there is a need to improve a speed of charging of a battery as well as a life of the battery (in terms of years and in terms of charge/discharge cycles).

SUMMARY

According to an implementation of the present specification, there is provided a method to charge a battery pack, the method comprising: determining a temperature of the battery pack; comparing the temperature of the battery pack with a reference temperature value; in response to determining that the temperature of the battery pack is less than the reference temperature value, applying heating-optimized pulses, having a first frequency, to the battery pack, the heating-optimized pulses comprising a sequence of alternating positive and negative pulses, wherein the heating-optimized pulses carry a net positive charge; concurrent to applying the heating-optimized pulses to the battery pack, determining the temperature of the battery pack; and in response to determining that the temperature of the battery pack is more than the reference temperature value, applying charging current to the battery pack.

The applying the charging current to the battery pack may comprise applying charging-optimized pulses, having a second frequency, to the battery pack, the charging-optimized pulses comprising a sequence of alternating positive and negative pulses, and wherein the charging-optimized pulses carry a net positive charge.

An amplitude of positive pulses comprised in the heating-optimized pulses may be greater than an amplitude of positive pulses comprised in the charging-optimized pulses, and wherein an amplitude of negative pulses comprised in the heating-optimized pulses may be greater than an amplitude of negative pulses comprised in the charging-optimized pulses.

A value of the net positive charge carried by the charging-optimized pulses may be same as a value of the net positive charge carried by the heating-optimized pulses.

A value of the net positive charge carried by the charging-optimized pulses may be greater than a value of the net positive charge carried by the heating-optimized pulses.

The method may further comprise prior to comparing the temperature of the battery pack with the reference temperature value: determining a state of charge (SoC) of the battery pack; and based on the SoC of the battery pack, determining the reference temperature value.

The method may further comprise determining one or more parameters of the charging-optimized pulses based at least on the temperature of the battery pack, wherein the one or more parameters comprise: on duration, amplitude, duty cycle, shape, rest time, frequency, and rate of change of frequency.

The method may further comprise determining a value of one or more of the first frequency and the second frequency based on Electrochemical Impedance Spectroscopy (EIS) measurements corresponding to the battery pack.

At least one of the heating-optimized pulses, and the charging-optimized pulses may comprise sinusoidal pulses.

The applying the charging current to the battery pack may comprise applying constant charging current to the battery pack.

According to another implementation of the present specification, there is provided a controller to control charging a battery pack, the controller comprising: at least one processor; and a non-transitory computer-readable storage medium configured to store instructions, wherein the instructions, in response to execution, by the at least one processor, cause the controller to perform or control performance of operations that comprise: determine a temperature of the battery pack; compare the temperature of the battery pack with a reference temperature value; in response to determining that the temperature of the battery pack is less than the reference temperature value, applying heating-optimized pulses, having a first frequency, to the battery pack, the heating-optimized pulses comprising a sequence of alternating positive and negative pulses, wherein the heating-optimized pulses carry a net positive charge; concurrent to applying the heating-optimized pulses to the battery pack, determine the temperature of the battery pack; and in response to determining that the temperature of the battery pack is more than the reference temperature value, apply charging current to the battery pack.

The operation to apply the charging current to the battery pack may comprise an operation to apply charging-optimized pulses, having a second frequency, to the battery pack, the charging-optimized pulses comprising a sequence of alternating positive and negative pulses, and wherein the charging-optimized pulses carry a net positive charge.

An amplitude of positive pulses comprised in the heating-optimized pulses may be greater than an amplitude of positive pulses comprised in the charging-optimized pulses, and wherein an amplitude of negative pulses comprised in the heating-optimized pulses may be greater than an amplitude of negative pulses comprised in the charging-optimized pulses.

A value of the net positive charge carried by the charging-optimized pulses may be same as a value of the net positive charge carried by the heating-optimized pulses.

A value of the net positive charge carried by the charging-optimized pulses may be greater than a value of the net positive charge carried by the heating-optimized pulses.

The operations may further comprise prior to comparing the temperature of the battery pack with the reference temperature value: determine a state of charge (SoC) of the battery pack; and based on the SoC of the battery pack, determine the reference temperature value.

The operations may further comprise determine one or more parameters of the charging-optimized pulses based at least on the temperature of the battery pack, wherein the one or more parameters comprise: on duration, amplitude, duty cycle, shape, rest time, frequency, and rate of change of frequency.

The operations may further comprise determine a value of one or more of the first frequency and the second frequency based on Electrochemical Impedance Spectroscopy (EIS) measurements corresponding to the battery pack.

The controller may be implemented in a battery pack.

The controller may be implemented in a power source that provides power to charge the battery pack.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings.

DETAILED DESCRIPTION OF THE DISCLOSURE

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage, or mode of operation.

The terminology used herein is provided to describe particular embodiments only and is not intended to limit any embodiments disclosed herein. As used herein, the singular forms "a," "an," and "the" are intended to include the plural forms as well, unless the context clearly indicates otherwise. It will be further understood that the terms "comprises," "comprise," "includes," and/or "including," when used herein, specify the presence of stated features, integers, steps, operations, elements, and/or components, but do not preclude the presence or addition of one or more other features, integers, steps, operations, elements, components, and/or groups thereof.

Unless defined otherwise, all technical and scientific terms used herein have the same meaning as commonly understood by one of ordinary skill in the art to which this disclosure belongs.

Figure 1:
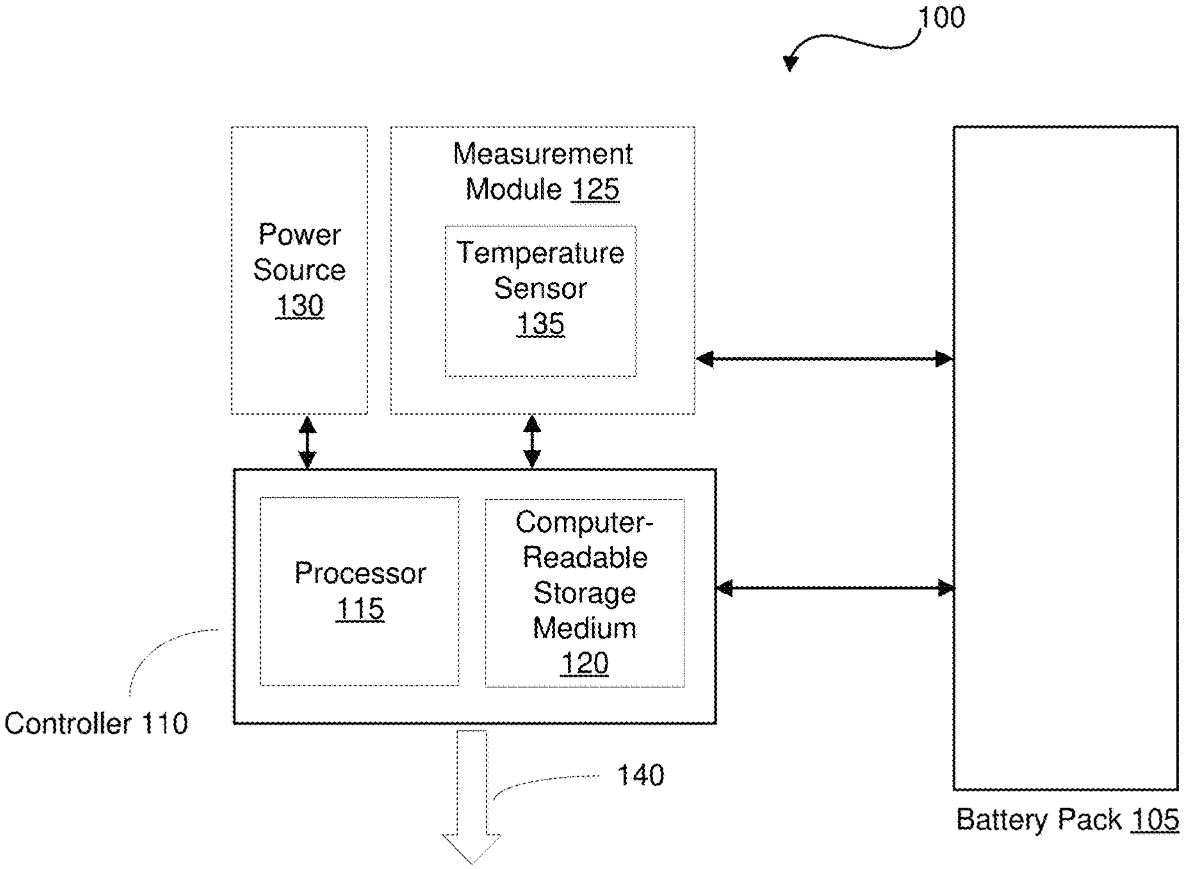
FIG. 1 shows a block diagram of an example system for battery pack charging, in accordance with some implementations of the present specification.

FIG. 1 shows an example battery charging system 100 in accordance with a non-limiting implementation of the present specification. The system 100 comprises a battery pack 105. In some implementations, the battery pack 105 may comprise a single rechargeable battery cell. In some implementations, the battery pack 105 may comprise a plurality of rechargeable battery cells. In some implementations, the battery cells inside the battery pack may be arranged in many configurations, e.g., series-connected battery cells, parallel-connected battery cells, or a combination of series-connected and parallel-connected battery cells. In some implementations, the battery pack 105 may comprise a plurality of battery modules connected to each other in series or parallel, each battery module may further include battery cells arranged in different series and parallel configurations.

In some implementations, the battery pack 105 may be a lithium ion battery pack, which may comprise one or more lithium ion battery cells. In some implementations, the battery pack 105 may comprise, but not limited to, silicon anode battery cell(s), lithium metal battery cell(s), sodium ion battery cell(s), nickel cadmium battery cell(s), nickel metal hydride battery cell(s), lead acid battery cell(s), solid state battery cell(s), or the like. The systems, methods, and devices described herein are not limited by the number or type of battery cells in the battery pack 105.

The system 100 further comprises a controller 110, which is operatively coupled to the battery pack 105. The controller 110 may control at least charging and discharging of the battery pack 105 in accordance with the methods described herein. For example, the controller 110 may perform or control performance of operations of an example method 200 illustrated in FIG. 2. The controller 110 may comprise at least one processor 115 to charge the battery pack 105. The controller 110 may further comprise a non-transitory computer-readable storage medium 120 which may store instructions, which are executable by the processor 115 for the controller 110 to perform or control performance of operations in relation to charging of the battery pack 105 in accordance with the methods described herein. For example, the processor 115 may execute the instructions stored in the computer-readable storage medium 120 which may cause the controller 110 to perform or control performance of an example method 200 illustrated in FIG. 2. The computer-readable storage medium 120 may be a computer memory or storage device which may be any suitable memory apparatus, such as, but not limited to ROM, PROM, EEPROM, RAM, flash memory, disk drive or the like.

In some implementations, the controller 110 may facilitate charging of the battery pack 105 by employing any of the charging protocols including, but not limited to, CC-CV charging protocol, a pulse charging protocol, a constant current protocol, a constant voltage protocol, or the like.

In some implementations, the controller 110 may be a microcontroller and may comprise a central processing unit (e.g., processor 115) to process instructions and data, on-board memory to store instructions and data, a digital to analog converter for analog data conversion obtained from other modules of the system 100, and drive circuitry for control of the various modules of the system 100.

In some implementations, the controller 110 may also monitor (e.g., measure using a measurement module 125) various parameters of the battery pack 105, and use the monitored parameters to manage operation of the battery pack 105. The various parameters monitored by the controller 110 may comprise, but not limited to, voltage, current, state of charge (SoC), temperature, state of health, or the like. Additionally, the controller 110 (e.g., processor 115) may calculate various values, which include but not limited to charge current limit (CCL), discharge current limit (DCL), energy delivered since last charge or discharge cycle, internal impedance, and charge delivered or stored (coulomb counter) for the battery pack 105 as well as individual battery cells in the battery pack 105. In some implementations, the controller 110 may also determine a thickness of SEI layer of the battery cells of the battery pack 105, which may be used to adapt or control charging or discharging of the battery pack 105 accordingly.

In some implementations, the controller 110 may implement a battery model that may be used to determine how the charging parameters may be adapted or implemented in accordance with the methods disclosed herein. Such a battery model may be built during the battery characterization or battery training. For example, in the characterization phase, the battery pack 105 may be slowly charged for a number of cycles, and optimized battery charging parameters (e.g., optimized for speed of charge, for cycle life of battery, and/or for calendar life of battery) may be determined from such slow charging cycles. Such optimized charging parameters may be registered, and the battery model may be built. In an example, battery parameters such as capacity, and CCV of the battery (e.g., during discharging pulse) may be stored against pulse parameters, and make-up the battery model. Such battery model may be used by the controller 110 to adapt battery charging as disclosed herein.

In some implementations, the controller 110 may include an artificial intelligence-based logic (e.g., implemented by the processor 115), and the controller 110 may be a self-learning controller. Such a controller may build the battery model during charging and/or discharging of the battery, and may learn how to adapt the battery charging based on the data in the battery model and/or based on actual battery measurements performed during charging and/or discharging of the battery pack 105.

In some implementations, the controller 110 may be configured to generate control pulses that are provided to a plurality of switches (e.g., switches show in FIGS. 4 and 5) to control operation of the switches to produce positive pulses (charging pulses) and/or negative pulses (discharging pulses) to charge the battery pack 105. In accordance with the present disclosure, in an example, the controller 110 may modulate the frequency (e.g., pulse period) of the control pulses. For example, the controller 110 may control the duration of the ON period and the OFF period of each control pulse that leads to modulation of the pulse period of the positive pulses and/or negative pulses. In some embodiments, for example, the switches may be field effect transistor (FET) devices. The switches may be controlled (ON, OFF) to apply positive and/or negative pulses to the battery pack 105.

As can be seen in FIG. 1, the system 100 further comprises a measurement module 125 (e.g., sensors and associated circuitry) to measure various parameters of the battery pack 105 and/or battery cells of the battery pack 105. In some implementations, the measurement module 125 is operatively coupled to the battery pack 105 and the controller 110, and may be controlled by the controller 110 to perform various measurement related operations to charge or discharge the battery pack 105 in accordance with the methods disclosed herein.

The measurement module 125 comprises a temperature sensor 135 to determine temperature of the battery pack 105, or temperature of one or more battery cells comprised in the battery pack 105. In some implementations, the temperature sensor 135 may be arranged adjacent to the battery pack 105 when the temperature of the battery pack 105 itself needs to be sensed. In some implementations, the temperature sensor 135 may be arranged at a location where the internal temperature of the battery pack 105 may be precisely measured. In some implementations, the temperature sensor 135 may be arranged adjacent to the battery cells in the battery pack 105 to sense a temperature of the battery cell when the battery cell is being charged/discharged. For example, the temperature sensor 135 may be provided on conductive terminals of the battery cells, or may be provided on a bus bar connecting the battery cells in the battery pack 105. In some implementations, the battery pack 105 may include a plurality of temperature sensors 135, the number of which may be equal to that of the number of battery cells in the battery pack 105.

Some limiting examples of the temperature sensor 135 comprise a thermistor, a winding resistor-type sensor, a wide area resistance sensor, a semiconductor diode sensor, a metal core-type sensor, or a thermocouple. In an example, the temperature sensor 135 may include a thermistor having a resistance value that varies based on a peripheral temperature. For example, the temperature sensor 135 may include a thermistor having a negative temperature coefficient (resistance value decreases as the peripheral temperature increases), or a thermistor having a positive temperature coefficient (the resistance value increases as the peripheral temperature increases).

The temperature sensor 135 may transfer information about sensed temperature of the battery pack 105 or battery cells in the battery pack 105 to the controller 110, which uses the temperature information to control battery charging in accordance with the methods described herein.

The measurement module 125 may further comprise various sensors, such as, but not limited to, ammeter, voltmeter, coulomb counter, or the like. In some implementations, the measurement module 125 may also comprise some mechanical sensors such as, but not limited, to piezo-electric sensors (for determining battery swelling which is indicative of imbalance in the battery pack or mechanical stress inside the battery).

Various parameters that may be measured by the measurement module 125 and as controlled by the controller 110 may comprise voltage (e.g., open circuit voltage (OCV), closed-circuit voltage (CCV), current (e.g., charging current or discharging current), temperature, state-of-charge (SoC), or the like), for the battery pack 105 as well as individual battery cells of the battery pack 105. In some implementations, the measurement module 125 may comprise circuitry to determine thickness of SEI layer of the battery pack 105.

In some implementations, the measurement module 125 may be implemented as a part of the controller 110, and the controller 110 may be configured to measure and determine values of various parameters (such as of current, voltage, temperature, SoC, SEI layer thickness or the like) for the battery pack 105.

The system 100 further comprises a power source 130, which may be, for example, a dedicated adaptor, such as AC-to-DC wall adapter. In most cases, such adaptors are designed with the specific battery charging needs in mind, and thus the source capabilities of the power source 130 allow for proper capacity-based charging current of batteries, such as battery pack 105. In some implementations, the power source 130, may be, for example, a non-dedicated adaptor, such as a universal battery charger not necessarily designed with any specific battery capacity in mind. As another example, the power source 130 may be a communication or computer bus voltage signal, intended to provide power to a number of devices connected in parallel or serially to the bus. One non-limiting example of this type of voltage source is a Universal Serial Bus (USB) connection, which provides a voltage bus (VBUS) signal from which a constrained amount of current may be drawn. Another example of the power source 130 may be a USB-C connector, which is a 24-pin USB connector system, which is distinguished by its two-fold rotational-symmetrical connector. The controller 110 may interface with the power source 130 to obtain power to facilitate charging of the battery pack 105 in accordance with the present disclosure.

In some implementations, the power source 130 may comprise or be coupled to circuitry to apply positive and/or negative pulses to the battery pack 105 for battery pack charging in accordance with the methods disclosed herein. In an example implementation, the power source 130 may be a power source 410 or a power source 510 (FIGS. 4 and 5) that provides power to apply positive and/or negative pulses to the battery pack 105 for battery pack charging in accordance with the methods disclosed herein.

In some implementations, the power source 130 may be a charging device for electric vehicles (e.g., charging station or an electric vehicle (EV) charger).

The system 100 further comprises a communication interface 140 for the controller 110 to communicate with the hardware within the battery pack 105, and/or with the circuitry to be controlled by the controller 110 for charging or discharging of the battery pack 105. For example, the communication interface 140 may enable communication of the controller 110 with an example systems 400, 500 (FIGS. 4 and 5) to control various elements or components of those systems for the battery charging in accordance with the methods disclosed herein.

It is contemplated that a person of ordinary skill in the art may vary implementation of the system 100 and such variations are within the scope of the present disclosure. In some implementations, the controller 110 may be implemented in the power source 130 (e.g., as a component of the power source 130). For example, the controller 110 may be housed in a housing of the power source 130. Similarly, in other implementations, the controller 110 may be implemented in the battery pack 105 (e.g., as a component of the battery pack 105). For example, the controller 110 may be housed in a housing of the battery pack 105. In some implementations, the controller 110 may be implemented as a separate module (e.g., add-on module) which may interface with the power source 130 (e.g., an EV charging station), and/or example systems 400, 500 to charge the battery pack 105 in accordance with the methods disclosed herein.

Another such example variation may be that the functionality of the controller 110 may be implemented in two different controllers, such as a charging controller, and a discharging controller. The charging controller may be operative to apply charging current (e.g., in the form of positive pulses (also referred to as "charging pulses" in some parts of this disclosure)) to the battery (e.g., battery pack 105), and the discharging controller may be to apply discharging current (in the form of negative pulses (also referred to as "discharging pulses" in some parts of the disclosure)) to the battery during charging of the battery (e.g., battery pack 105) in accordance with the methods disclosed herein. Either or both of the charging controller and the discharging controller may perform or control performance of operations of an example method 200 illustrated in FIG. 2. In an example, the charging controller may be implemented as a component of the power source 130 (e.g., an EV charging station), and the discharging controller may be implemented in a separate add-on module that may interface with the battery pack 105 and the power source 130.

Figure 2:
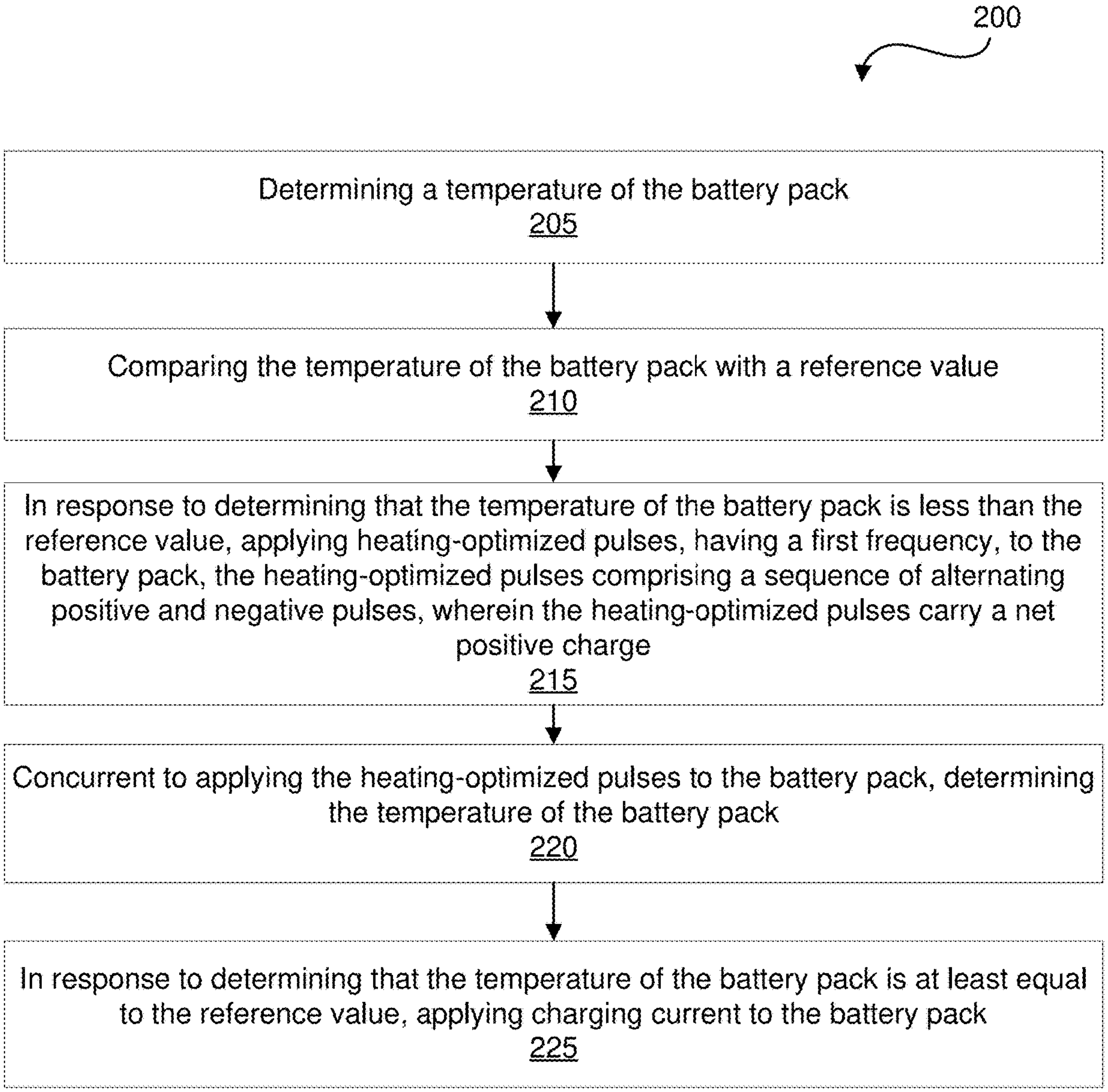
FIG. 2 shows a flowchart of an example method of battery pack charging, in accordance with some implementations of the present specification.

Turning now to FIG. 2, a flowchart illustrating an example method for charging of a battery pack 105 in accordance with a non-limiting implementation of the present specification is provided. The method 200 illustrated in FIG. 2 may be performed by the controller 110 for charging of the battery pack 105. In some implementations, the controller 110 may employ example hardware illustrated in FIGS. 4 and 5 to perform the method 200.

The method 200 begins at 205, where a temperature of the battery pack is determined. In some example implementations, the temperature sensor 135 may measure a temperature of the battery pack or battery cells in the battery pack 105 individually. The data corresponding to the measured temperature of the battery pack 105 may be obtained by the controller 110 from the temperature sensor 135. Based on the temperature data obtained from the temperature sensor 135, the temperature of the battery pack 105 is determined. In some implementations, where the temperature data comprises temperature of the individual cells of the battery pack 105 (rather than the temperature of the battery pack 105 as whole), the temperature of the battery pack 105 may be calculated, for example, by averaging out the temperature of the battery cells of the battery pack 105.

At 210, the temperature of the battery pack 105 is compared with a reference temperature value. The reference temperature value may be a preferred temperature value to charge the battery pack 105. In other words, when the temperature of battery pack 105 is equal to or more than the reference temperature value, that is considered as an optimal condition to charge the battery pack 105. The reference temperature value may be a temperature at which ion mobility (e.g., Li-ion) inside the battery cell of the battery pack is increased, but electrolyte and active material aging effects that come with higher temperature are still not very pronounced. The reference temperature value may be identified based on a series of tests performed during battery characterization.

In some implementations, the reference temperature value (e.g., the minimum optimal temperature for the battery pack) may depend upon state of charge (SoC) of the battery pack 105. In other words, the reference temperature value (to which the temperature of the battery pack is to be compared) may be different for different SoC values of the battery pack 105. For example, when the SoC of the battery pack 105 is in one range e.g., 20%-30% range, the reference temperature value may have one value, and when SoC of the battery pack is another range, e.g., 50-70%, the reference temperature value has another value. In other words, when the SoC of the battery pack 105 is in one range e.g., 20%-30% range, it is optimum for the temperature of battery pack 105 to be more than the first value, and when the SoC of the battery pack is another range, e.g., 50-70% range, it is optimum for the temperature of the battery pack 105 to be more than the second value (which is different than first value).

Therefore, in some implementations, prior to comparing the temperature of the battery pack 105 with the reference temperature value, the SoC of the battery pack 105 is determined. Based on the SoC of the battery pack 105, the reference temperature value, to which the temperature of the battery pack 105 is to be compared, is determined. In some implementations, a look-up table that maps reference temperature values to different SoC values (e.g., Soc ranges) of the battery pack 105 may be implemented, e.g., by the controller 110, to determine the reference temperature value for the comparison.

In some implementations, the temperature of the battery pack 105 that is optimal for charging, is selected based on a capability of the power source source. In other words, the battery pack 105 may be pre-heated or pre-cooled to a particular temperature, which is based on the capability of the power source (e.g., EV charging station). For example, when the power source is capable to apply charging pulses of up to a particular frequency (e.g., 100 kHz), then the temperature to which the battery pack is heated or cooled (before charging) is selected based on the frequency capability of the power source.

At 215, in response to determining that the temperature of the battery pack 105 is less than the reference temperature value, heating-optimized pulses are applied at a first frequency to the battery pack. The heating-optimized pulses comprises a sequence of alternating positive and negative pulses. In other words, the heating-optimized pulses comprises a set of pulses, in which each positive pulse (also referred to as charging pulse) is followed by a negative pulse (also referred to as discharging pulse) and vice-versa.

The heating-optimized pulses are applied at a particular frequency (e.g., first frequency) to the battery pack 105, and the heating-optimized pulses carry a net positive charge. In an example, the first frequency may be 1 kHz. In some implementations, the heating-optimized pulses may carry high current (e.g., up to 1 C) or very high current (e.g., up to 10 C).

In some implementations, the first frequency at which the heating-optimized pulses are applied to the battery pack 105 is determined based on the temperature of the battery pack 105. In some implementations, the first frequency at which the heating-optimized pulses are applied to the battery pack 105 is determined based on Electrochemical Impedance Spectroscopy (EIS) measurements of the battery pack 105. Additionally, or alternatively, other parameters of the heating-optimized pulses, such as, but not limited to, On duration, amplitude, duty cycle, shape, rest time between pulses, and rate of change of frequency, are also determined based on the EIS measurements of the battery pack 105.

The heating-optimized pulses carry a net positive charge, which is an amount of charge applied by the positive pulses to the battery pack 105 is greater than the amount of charge removed from the battery pack 105 by the negative pulses. Since the amount of charge applied by the positive pulses to the battery pack 105 is greater than the amount of charge removed from the battery pack 105 by the negative pulses, the net effect on a state of charge (SoC) of the battery pack 105 is positive.

In some implementations, amplitude of positive pulses and negative pulses of the heating-optimized pulses is selected to be such that the battery pack is heated to at least the reference temperature value. For example, the amplitude of positive pulses and negative pulses of the heating-optimized pulses may be selected to be at the maximum possible level to heat the battery pack to at least the reference temperature value The maximum possible level for the amplitude of the heating-optimized pulses may be based on capability of the power source, capability of pulse generation hardware employed, or current level constraints for the battery cells of the battery pack 105 (which may be defined by the manufacturer of the battery cells). While the pulse amplitude is maintained at the highest level, a difference between the amplitude of the positive and negative pulses of the heating-optimized pulses is kept at a minimum possible value. The minimal difference between the amplitude of the positive and negative pulses allows to perform a slow charge of the battery pack 105, while most of the energy from the positive and negative pulses is used to heat the battery pack 105.

At 220, concurrent to applying the heating-optimized pulses to the battery pack 105, the temperature of the battery pack is determined again. In some implementations, the temperature of the battery pack 105 is determined after a pre-defined (e.g., particular) amount of time from the application of the heating-optimized pulses to the battery pack 105 has lapsed. In some implementations, the temperature of the battery pack 105 is continuously monitored while the heating-optimized pulses are applied to the battery pack 105 to determine if the temperature of the battery pack 105 is now more than the reference temperature value. In other words, with the heating-optimized pulses being applied to the battery pack 105, the temperature of the battery pack 105 tends to rise. The temperature of the battery pack 105 is being monitored to determine if the temperature of the battery pack 105 is more than the reference temperature value.

It is to be noted that in context of this disclosure "more than" is intended to cover "equal to or more than". For example, determining that the temperature of the battery pack 105 is more than the reference temperature value also covers determining that the temperature of the battery pack 105 is equal to the reference temperature value.

At 225, in response to determining that the temperature of the battery pack 105 is more than the reference temperature value, the charging current is applied to the battery pack 105 to charge the battery pack 105.

In some implementations, the charging current applied to the battery pack 105 is constant charging current (CC charging mode).

In some implementations, in response to determining that the temperature of the battery pack 105 is more than the reference temperature value, the charging current is applied to the battery pack 105 in the form of charging-optimized pulses. The charging-optimized pulses being applied to the battery pack 105 at a second frequency. In some implementations, the second frequency is different than the first frequency.

The charging-optimized pulses comprise a sequence of alternating positive and negative pulses. In other words, the charging-optimized pulses comprise a set of pulses, in which each positive pulse (also referred to as charging pulse) is followed by a negative pulse (also referred to as discharging pulse) and vice-versa.

The charging-optimized pulses carry a net positive charge. An amount of charge applied by the charging-optimized positive pulses to the battery pack 105 is greater than the amount of charge removed from the battery pack 105 by the charging-optimized negative pulses. Since the amount of charge applied by the positive pulses to the battery pack 105 is greater than the amount of charge removed from the battery pack 105 by the negative pulses, the net effect on a state of charge (SoC) of the battery pack 105 is positive.

In some implementations, the second frequency at which the charging-optimized pulses are applied to the battery pack 105 is determined based on Electrochemical Impedance Spectroscopy (EIS) measurements of the battery pack 105. Additionally, or alternatively, other parameters of the charging-optimized pulses, such as, but not limited to, On duration, amplitude, duty cycle, shape, rest time between pulses, and rate of change of frequency, are also determined based on the EIS measurements of the battery pack 105. Therefore, in some implementations, prior to applying the charging-optimized pulses to the battery pack 105, one or more parameters of the charging-optimized pulses are determined (e.g., by the controller 110) based on the EIS measurements of the battery pack 105.

In some implementations, the first frequency corresponding to the heating-optimized pulses is higher than the second frequency corresponding to the charging-optimized pulses, as the application of pulse-after-pulse sequence at the high frequencies results in elevation of the battery temperature.

The charging-optimized pulses are different than the heating-optimized pulses. The charging-optimized pulses are different than the heating-optimized pulses in terms of amplitude of positive pulses and negative pulses comprised in the charging-optimized pulses and the heating-optimized pulses. The amplitude of positive pulses comprised in the heating-optimized pulses is greater than an amplitude of positive pulses comprised in the charging-optimized pulses, and the amplitude of negative pulses comprised in the heating-optimized pulses is greater than an amplitude of negative pulses comprised in the charging-optimized pulses. In other words, an absolute value of the amplitude of positive pulses comprised in the heating-optimized pulses is greater than an absolute value of the amplitude of positive pulses comprised in the charging-optimized pulses, and an absolute value of the amplitude of negative pulses comprised in the heating-optimized pulses is greater than an absolute value of the amplitude of negative pulses comprised in the charging-optimized pulses As described previously, for the heating-optimized pulses, the amplitude of positive pulses and negative pulses is selected to be such that most of the energy from the heating-optimized pulses is used to raise the temperature of the battery pack 105, and little energy from the heating-optimized pulses is used to charge the battery pack (slow charging). In that, the amplitude of the positive pulses and negative pulses in the heating-optimized pulses is selected to be at maximum possible level (optimum for raising the temperature of the battery pack), while the difference between the positive pulses and the negative pulses is kept at a minimum value (for slow charging the battery pack 105). In contrast, for the charging-optimized pulses, the amplitude of positive pulses and negative pulses is selected to be such that most of the energy from the charging-optimized pulses is being used to charge the battery pack 105, while raising the temperature of the battery pack 105 by minimal. In that, the amplitude of positive pulses and negative pulses in the charging-optimized pulses is selected to be at a level that is optimal for charging the battery pack 105 at a desired rate (e.g., 1 C or the like).

In some implementations, the difference between the amplitude of positive pulses and negative pulses of the heating-optimized pulses may be same as the difference between the amplitude of positive pulses and the negative pulses of charging-optimized pulses, thus resulting in a value of the net positive charge carried by the charging-optimized pulses being same as a value of the net positive charge carried by the heating-optimized pulses. However, since the absolute values of the amplitude of positive pulses and negative pulses of the heating-optimized pulses is greater than the absolute values of the amplitude of positive pulses and negative pulses of the charging-optimized pulses, the heating-optimized pulses results in elevation of the temperature of the battery pack 105.

In some implementations, the difference between the amplitude of positive pulses and negative pulses of the heating-optimized pulses may be smaller the difference between the amplitude of positive pulses and the negative pulses of charging-optimized pulses, thus resulting in the net positive charge carried by the charging-optimized pulses being greater than the net positive charge carried by the heating-optimized pulses. For example, if the battery pack is to be charged slowly, then the charging-optimized pulses may be generated to carry the same net positive charge as the heating-optimized pulses, though the absolute values of the amplitude of the heating-optimized pulses is much higher than the absolute values of the amplitude of the charging-optimized pulses, and if the battery pack is to be charged faster, then the charging-optimized pulses may be generated to carry the higher net positive charge than the heating-optimized pulses.

In some implementations, the amplitude of positive pulses and negative pulses may be continuously adapted based on the temperature of the battery pack 105. The adaptation of amplitude of the pulses of the pulse-after-pulse sequence may be continuous process (during the charging cycle), wherein the temperature of the battery pack 105 is monitored, and the amplitude of the positive pulses and negative pulses is adapted for temperature elevation or battery pack charging accordingly. For instance, if the temperature of the battery pack 105 is lower than a particular value, the amplitude of the positive pulses and negative pulses may be increased, whereas the difference between the amplitude of the positive pulses and negative pulses may be kept constant. Similarly, if the temperature of the battery is determined to higher than another particular value, the amplitude of positive pulses and negative pulses may be decreased, whereas the difference between the amplitude of the positive pulses and negative pulses may be kept constant.

In an example, when the battery pack 105 is at the first temperature, which is less than the reference temperature value, a first pulse-after-pulse sequence (heating-optimized pulses) is applied to the battery pack 105, where the amplitude of the positive pulses (charging pulses) is 20 A, and the amplitude of the negative pulses (discharging pulses) is −19.5 A, such the battery is being charged by 0.5 A current (I diff elev), which is difference between the positive pulses and negative pulses. The high amplitude of positive pulses (20 A) and negative pulses (−19.5 A) results in elevation of the battery temperature, while a low difference (0.5 A) between the amplitude of positive pulses and negative pulses results in slow charging of the battery pack 105.

Due to application of the heating-optimized pulses, the temperature of the battery pack 105 may increase to the second temperature, which is more than the reference temperature value. Once the temperature of the battery pack 105 has the value which is more than the reference temperature value, a second pulse-after-pulse sequence (charging-optimized pulses) is applied to the battery pack 105, where the amplitude of the positive pulses (charging pulses) is 5 A, and the amplitude of the negative pulses (discharging pulses) is −3 A, such the battery is being charged by 2 A current (I diff elev), which is difference between the amplitude of the positive pulses and negative pulses. The difference between amplitude of positive pulses (5 A) and negative pulses (−3 A), which is 2 A, results in battery pack charging, while optimal absolute values of amplitude of positive pulses and negative pulses (5 A and −3 A respectively) results in optimal (e.g., minimal) elevation of the battery temperature, which is important as after the certain temperature level (that may correspond to the reference temperature value), the battery degrades much faster.

As described previously, in some implementations, the temperature of the battery pack 105 may be continuously monitored. In response to determining that the temperature of the battery pack 105 has fallen below the reference temperature value, the heating-optimized pulses may be applied again to elevate the temperature of the battery pack 105 again. In other words, the controller 110 may switch from applying the charging-optimized pulses to applying the heating-optimized pulses in response to determining that the temperature of the battery pack 105 is now less than the reference temperature value.

In some implementations, response of the battery pack 105 to charging-optimized pulses is constantly analyzed. In some implementations, response of the battery pack 105 is determined by performing EIS measurements as described in commonly owned U.S. patent application Ser. No. 15/483,324, the contents of which are incorporated herein by reference in its entirety. As described in said patent application, charging pulses may be adjusted to be optimal for EIS measurement (measurement-optimized pulses) and then adjusted back to values optimal for charge (charging-optimized pulses).

In other words, measurement-optimized pulses are generated. The measurement-optimized pulses comprise a pseudo-random binary pulse sequence. Pulsed charging current produced using the pseudo-random binary pulse sequence is characterized as a form of band-limited white noise. While the battery pack 105 is being charged with pulsed charging current that is produced using the pseudo-random binary pulse sequence, a plurality of EIS measurements of the battery pack 105 is being made. The plurality of EIS measurements is made based on the pulsed charging current that is produced using the pseudo-random binary pulse sequence.

Based on the plurality of EIS measurements, parameters of charging-optimized pulses are adapted as the battery pack 105 is being charged. In some implementations, at least one of pulse lengths, pulse amplitudes, and pulse durations of the plurality of charging-optimized pulses is varied based on the plurality of EIS measurements.

In some implementations, a charging profile may comprise the heating-optimized pulses (e.g., pulses that are optimized for heating the battery to a particular temperature), the measurement-optimized pulses (e.g., pulses that are optimized for battery measurement), and the charging-optimized pulses. The charging profile including the measurement-optimized pulses and the charging-optimized pulses is also disclosed in commonly owned U.S. patent application Ser. No. 16/372,567, the contents of which are incorporated herein by reference.

The heating-optimized pulses and measurement-optimized pulses may not be charging-optimized, but such pulses may charge the battery, while the battery is being heated (e.g., by heating-optimized pulses) and the measurements are done on the battery (e.g., by measurement-optimized pulses).

In some implementations, the parameters of the charging-optimized pulses may depend upon the temperature to which the battery is heated by the heating-optimized pulses, and the measurements (e.g., temperature, electrochemical impedance spectroscopy (EIS) measurements, impedance measurements) done using the measurement-optimized pulses. In some implementations, charging profile that includes three different type of pulses is dynamic, and may vary based on the EIS measurements. In some implementations, the charging profile may comprise heating-optimized pulses and measurement-optimized pulses followed by CC-CV charging protocol to charge the battery. In some implementations, the heating-optimized pulses are continuously interspersed in the charging profile (e.g., among the charging-optimized pulses) to regularly maintain the battery pack 105 at the particular temperature. Such interspersing of the heating-optimized pulses may be based on state of charge of the battery pack 105. e.g., when the battery has SoC in a particular range, the battery pack 105 may be heated to less than the reference temperature value, that is selected for another SoC level of the battery, therefore, the presence of heating-optimized pulses may be less.

In some implementations, similar to charging, the battery pack 105 may be pre-heated or pre-cooled (until battery is in a particular temperature range) before the battery pack 105 is being discharged. The energy from the battery pack 105 may be used to pre-heat the battery pack 105 before the battery pack 105 starts discharging (e.g., before the battery pack 105 starts providing energy to load). In some implementations, the battery pack 105 may be pre-heated or pre-cooled only when the load is operating under some particular conditions. For example, the mode of operation of the load may determine whether the battery pack 105 needs to be pre-heated or pre-cooled before it starts discharging. In a non-limiting example, when the load is an electric car, the battery pack 105 may be pre-heated or pre-cooled when the electric car is operating in a SPORTS mode (i.e., when the more energy needs to be delivered to the car). In other operating modes such as ECO mode, the battery pack 105 may not be pre-heated or pre-cooled before it starts discharging.

Figure 3:
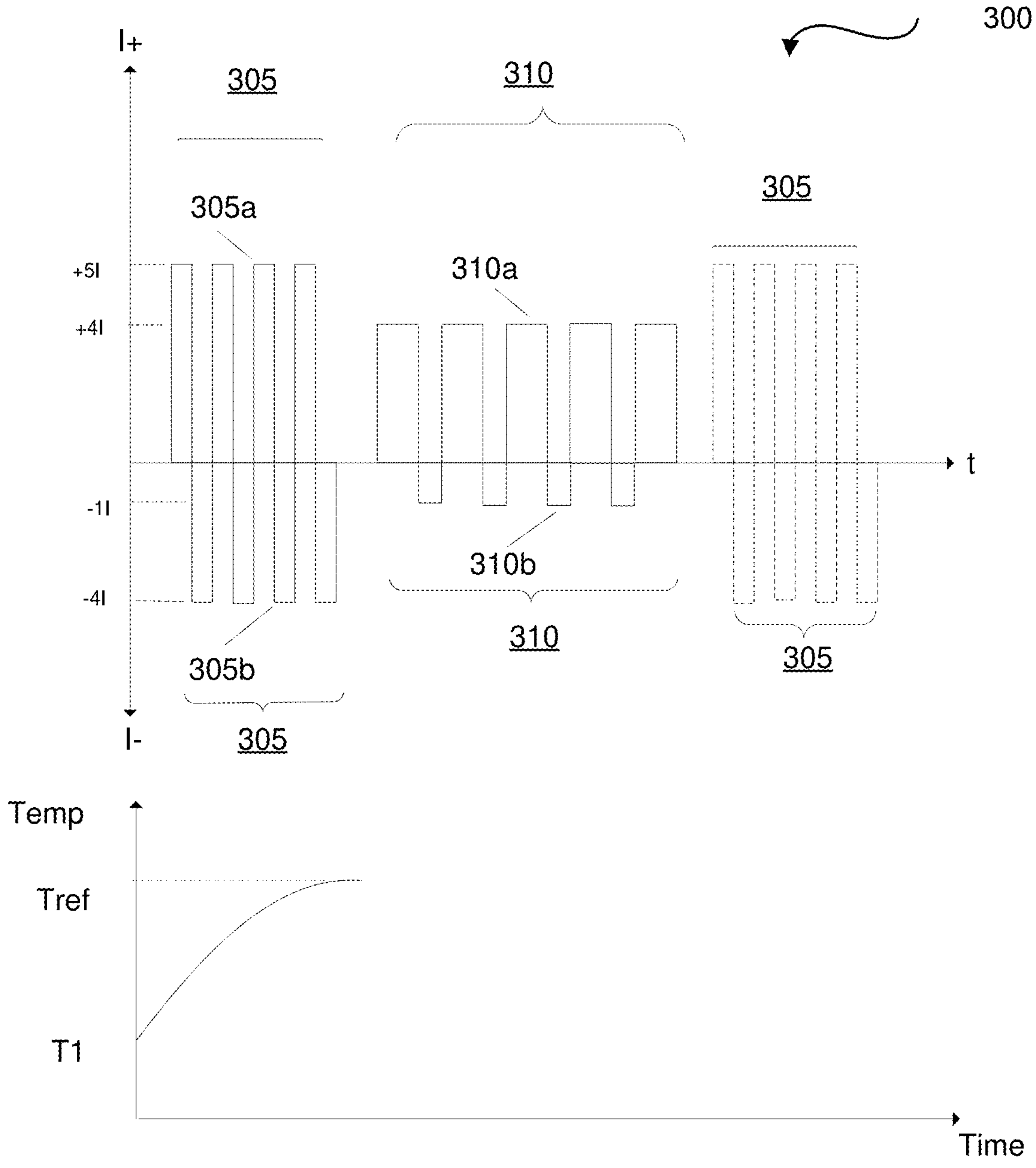
FIG. 3 shows example representation of application of heating-optimized pulses and charging-optimized pulses based on temperature of the battery pack, in accordance with some implementations of the present specification.

Turning now to FIG. 3, which shows example heating-optimized pulses and charging-optimized pulses. As can be seen in representation 300 of FIG. 3, heating-optimized pulses 305 comprise a sequence of alternating positive pulses 305*a* and negative pulses 305*b*, which is each positive pulse 305*a* is followed by a negative pulse 305*b* and vice-versa. The heating-optimized pulses 305 are applied to the battery pack 105, when the temperature of the battery pack 105 is determined to be less than Tref (reference temperature value), which can be seen in FIG. 3. When the temperature of the battery pack 105 is determined to be more than Tref, charging-optimized pulses 310 are applied to the battery pack 105. FIG. 3 shows switching from the heating-optimized pulses 305 to the charging-optimized pulses 310 as soon as the temperature of the battery pack 105 reaches Tref. The charging optimized pulses comprise a sequence of alternating positive pulses 310*a* and negative pulses 310*b*, which is each positive pulse 310*a* is followed by a negative pulse 310*b* and vice-versa.

Further, as can be seen in FIG. 3, the amplitude (+5I) of positive pulses 305*a* of the heating-optimized pulses 305 is more than an amplitude (+4I) of positive pulses 310*a* of the charging-optimized pulses 310. Similarly, the absolute value of the amplitude (−1I) of negative pulses 310*b* of the charging-optimized pulses 310 is less than the absolute value of the amplitude (−4I) of negative pulses 305*b* of the heating-optimized pulses 305. The higher absolute amplitude values of positive pulses 305*a* and negative pulses 305*b* (5I and 4I) and the lower difference between the amplitude values (+1I) results in elevation of the battery temperature, while slowly charging the battery by the heating-optimized pulses.

Furthermore, as can be seen in FIG. 3, heating-optimized pulses 305 that follow the charging-optimized pulses 310 are show in dashed lines to indicate that heating-optimized pulses 305 may be applied again to the battery pack 105 if the temperature of the battery pack falls below the Tref. In other words, the charging profile of the battery pack 105 may represent heating-optimized pulses interspersed between the charging-optimized pulses depending on the temperature of the battery pack 105 in relation to the reference temperature value Tref.

As described previously, the heating-optimized pulses 305 and charging-optimized pulses 310 have a different frequency. In other words, the heating-optimized pulses 305 are shown to be applied to the battery pack 105 at the first frequency, and charging-optimized pulses 310 are shown to be applied to the battery pack 105 at the second frequency. Varying the frequency of pulses as described herein may be based on temperature of the battery pack, or the EIS measurements of the battery pack.

In some implementations, the first frequency (of the heating-optimized pulses) and the second frequency (of charging-optimized pulses) may be dynamic, and may be swept among the set of values, which may be selected based on the current temperature of the battery pack 105. The frequency sweeping of charging pulses is disclosed in commonly owned patent applications: U.S. patent application Ser. No. 15/644,498 and U.S. patent application Ser. No. 16/190,236, the contents of which are incorporated herein by reference.

In some implementations, a look-up table may be implemented by a battery-management system (e.g., controller 110) that includes relationship between temperature, battery impedance, battery SoC, OHF, and charging/discharging pulse parameters. Such look-up table may be used to heat/cool the battery (pre-charging or pre-discharging) and select/adapt the charging protocol or discharging protocol, such as parameters of charging/discharging pulses. Such look-up table may also include frequency values (e.g., mapped to temperature and/or battery SoC values) for frequency sweeping of the positive and/or negative pulses in accordance with the present disclosure.

In FIG. 3, positive and negative pulses are shown to be continuous (e.g., pulse after pulse sequence), with no rest period between these pulses. However, it is contemplated that in some implementations, there may be a rest period after application of the positive pulse, and before application of the negative pulse (in the heating-optimized pulses or charging-optimized pulses). Similarly, in some implementations, another rest period may follow the application of the negative pulse and before application of the positive pulse (in the heating-optimized pulses or charging-optimized pulses). The system shown in FIG. 4 may be employed to apply such pulses, having rest periods between them, to the battery.

The positive and negative pulses used for temperature elevation and battery charging as described herein may be of any shape, such as but not lime to, square, rectangular, trapezoidal, triangle (saw tooth shape), or the like. In some implementations, the shape of the positive and negative pulses may follow a mathematical function. In some implementations, the heating-optimized pulses and the charging-optimized pulses may comprise sinusoidal pulses. In some implementations, one or more of: heating-optimized pulses and the charging-optimized pulses may comprise sinusoidal pulses, whereas other of these set of pulses may comprise some other shaped pulses, such as, but not limited to square, rectangular, trapezoidal, or the like.

Figure 4:
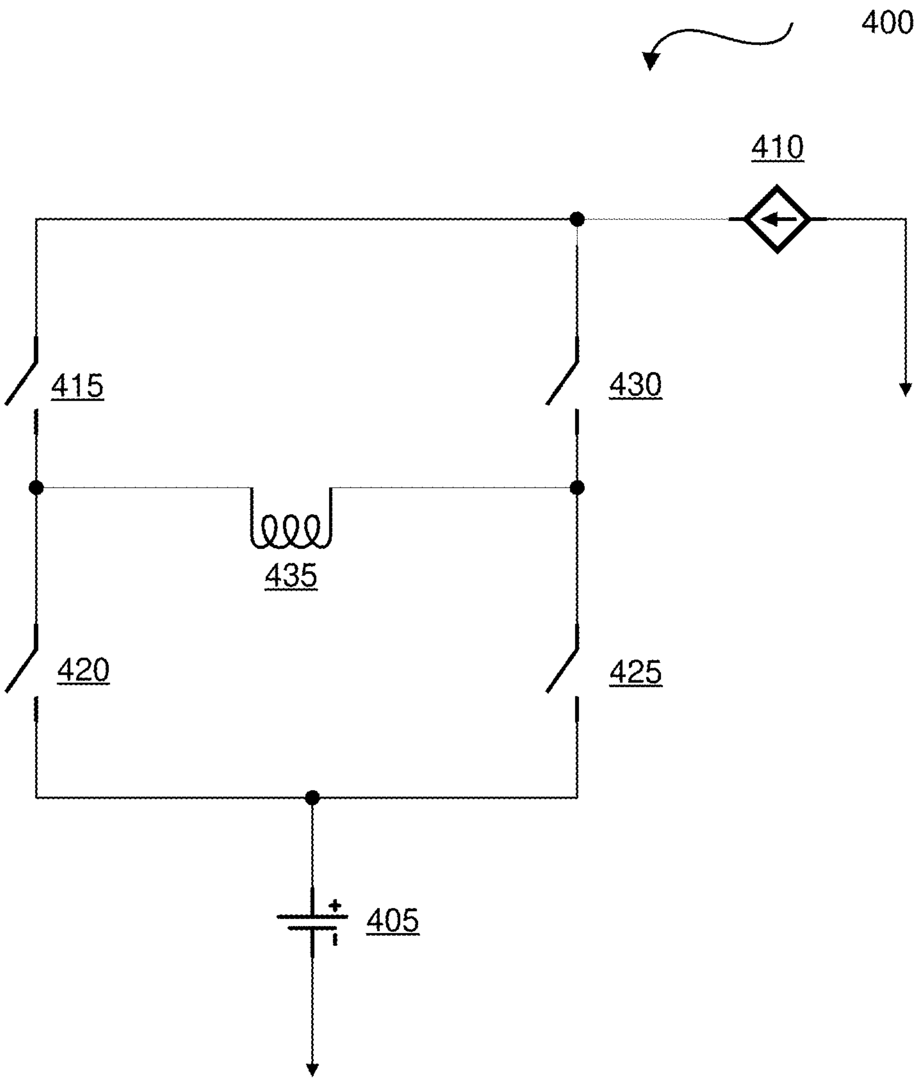
FIG. 4 illustrates an example system used for generating pulses, in accordance with some implementations of the present specification.

FIG. 4 illustrates an example system 400 that may be used for generation of positive pulses and negative pulses in accordance with some implementations of the present disclosure. The system 400 may be operatively coupled to a controller (e.g., controller 110) which may control the system 400, and various elements or components of the system 400 to enable the system 400 to be used for generation of positive pulses and negative pulses in accordance with the methods disclosed herein. For example, the controller 110 may control opening and closing of various switches of the system 400 to apply positive and negative pulses to the battery in accordance with the methods disclosed herein.

The system 400 comprises a power source 410, a plurality of switches (415, 420, 425, and 430), which may be FET switches, and an inductor 435 to apply positive and negative pulses to the battery 405 (e.g., battery pack 105) in accordance with the methods (e.g., method 200) disclosed herein. One pair of the switches (one of 415, 425 pair and 420, 430 pair) may be used to apply positive pulses to the battery 405, and other one of 415, 425 pair and 420, 430 may be used to apply negative pulses to the battery 405. In an example operation, when the switches 415, 425 are closed (ON position), while the switches 420, 430 are open (OFF position), the current from the power source 410 will flow through the closed switches 415, 425, and will charge the inductor 435, and thereby supply current for positive pulses applied to the battery 405. To provide negative pulses to the battery 405, the switches 420, 430 may be closed (ON position), and the switches 415, 425 may be opened (OFF position), thereby discharging the battery 405 through the inductor 435.

Another way of operation is to use switches 415, 425 for application of negative pulses to the battery 405, and to use the pair of switches 420, 430 for application of positive pulses to the battery 405. In that case, to apply positive pulses to the battery 405, the switches 420, 430 are closed, while switches 415, 425 remain opened, thereby providing current (positive pulses) to the battery 405 through the inductor 435. To apply negative pulses to the battery 405 (take current out of the battery), the switches 415, 425 are closed, while switches 420, 430 are opened.

Figure 5:
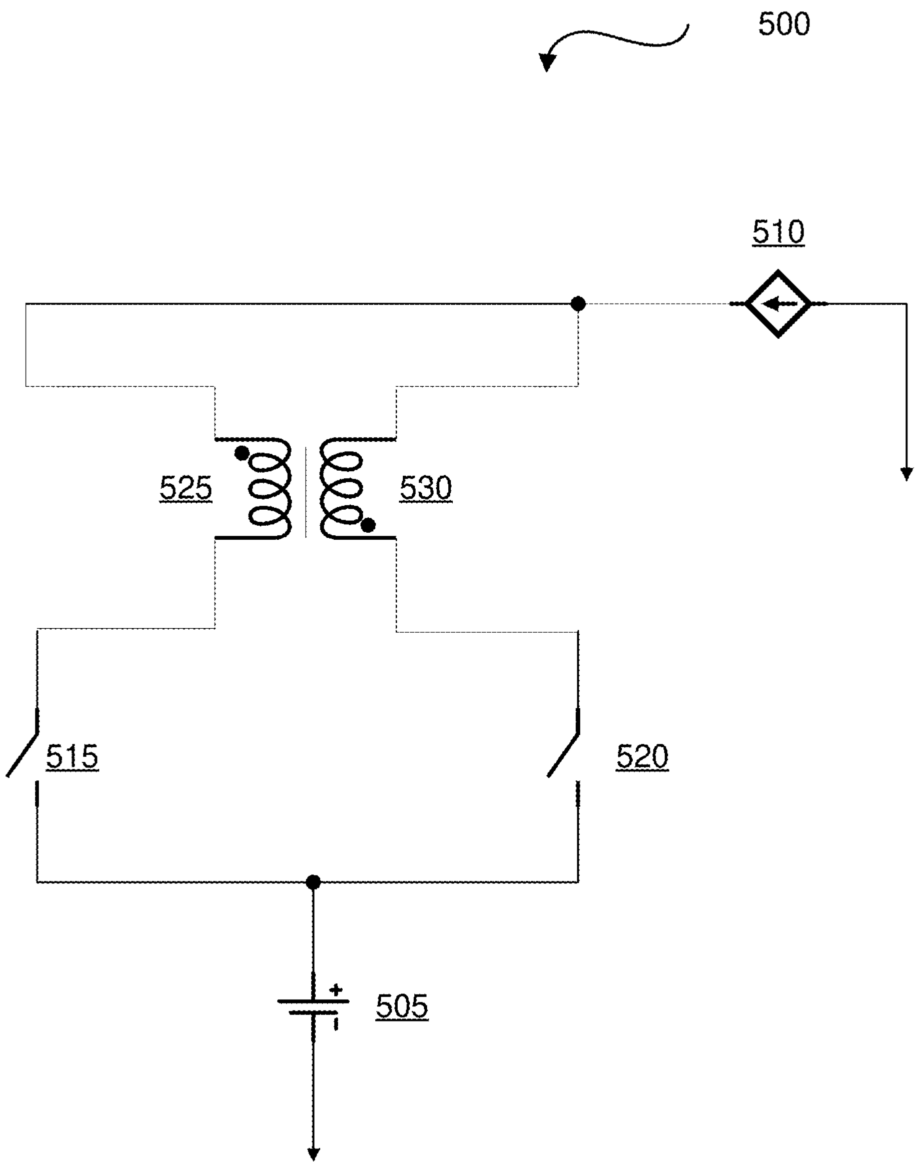
FIG. 5 illustrates another example system used for generating pulses, in accordance with some implementations of the present specification.

FIG. 5 illustrates another example system 500 that may be used for battery charging of a battery 505 (e.g., battery pack 105) in accordance with some implementations of the present disclosure. The system 500 may be operatively coupled to a controller (e.g., controller 110) which may control the system 500, and various elements or components of the system 500 to enable the system 500 to be used for battery charging in accordance with the methods disclosed herein. For example, the controller 110 may control opening and closing of various switches of the system 500 to apply positive and negative pulses to the battery in accordance with the methods disclosed herein.

The system 500 includes a power source 510, a pair of switches (515, 520), and a pair of inductor coils 525, 530 having opposite polarities to apply pulses to the battery 505 for battery charging. The system 500 appears to be simpler than the system 400 as it uses only two switches instead of four as used in system 400. However, the system 500 do not allow for the rest period between the pulses. In an operation, either of the switches 515, 520 may be used to provide positive pulses to the battery 505, and other of the switches 515, 520 may be used to provide negative pulses to the battery. For example, when switch 515 is selected as to be used to provide positive pulses to the battery 505, the switch 515 is closed (ON position), and the switch 520 remains open (OFF position) for the current (thereby positive pulses) to be applied to the battery 505 through inductor coil 525. Similarly, the switch 520 may be closed and the switch 515 may be opened to apply negative pulses to the battery 505, e.g., to take the current out of the battery 505 through the inductor coil 530.

In another way of implementation, the switch 520 may be selected as to be used to provide positive pulses to the battery 505, and the switch 515 may be selected to be used to provide negative pulses to the battery 505. For example, the switch 520 may be closed, and the switch 515 may remain open for the current (thereby positive pulses) from the power source 510 to be applied to the battery 505 through the inductor coil 530. Similarly, the switch 515 may be closed, and the switch 520 may be opened to apply negative pulses to the battery 505, e.g., take the current out of the battery through the inductor 525.

A person of ordinary skill in the art will understand that by controlling the switches as illustrated above, pulses (symmetrical or asymmetrical) may be applied to the battery for the battery charging. The example hardware illustrated in the FIGS. 5 and 6 above is much more energy efficient (as compared to conventional pulse generation approaches), since energy of negative (discharge) pulses is recuperated for the positive (charge) pulses by virtue of inductive element(s) acting as the energy reservoir in the circuits.

Figure 6:
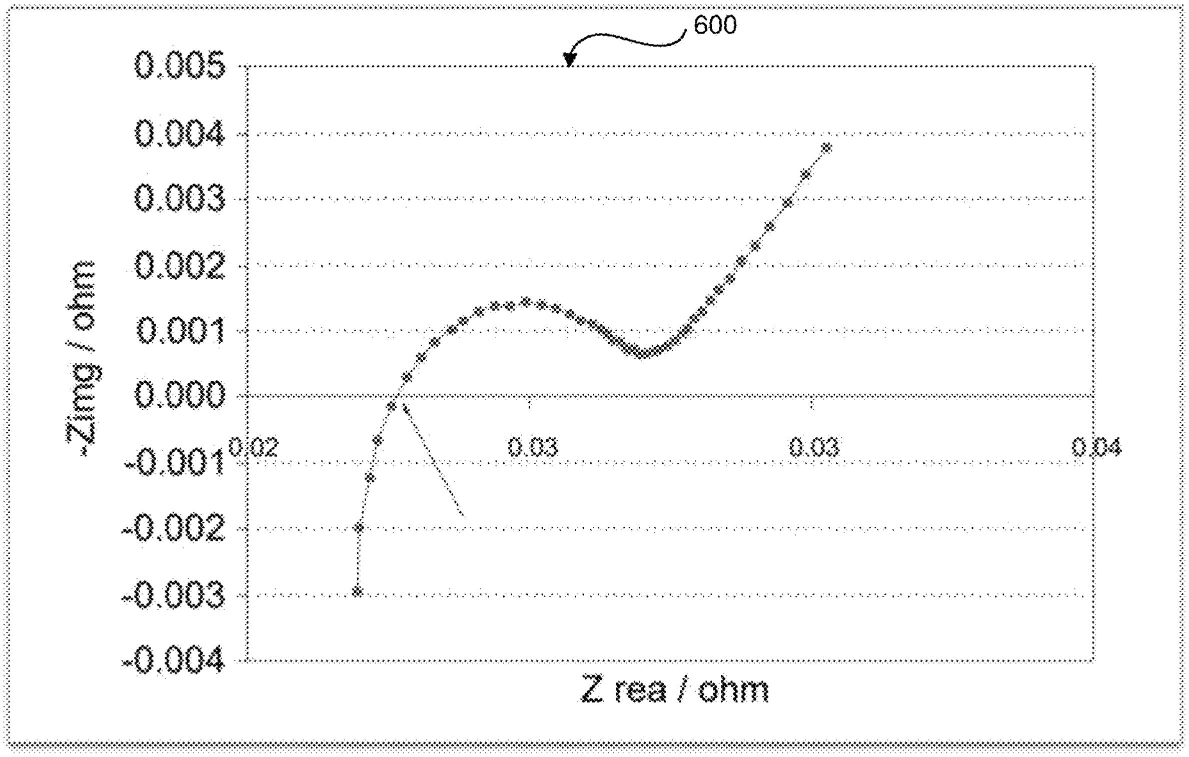
FIG. 6 shows an example Nyquist plot of impedance of a battery cell when a series of positive pulses are applied to the battery cell, in accordance with some implementations of the present specification.

FIG. 6 shows an example Nyquist plot 600 of impedance of a battery cell, when a series of positive pulses are applied to the battery cell. The Nyquist plot 600 shown in FIG. 6 is for a Panasonic 3 Ah 18650 cells at 50% state of charge. A sinusoidal shape positive pulses with frequencies in the range between 0.1 Hz . . . 2 kHz are applied to the battery cell, and the result is presented in the form of Nyquist plot 600. Each point of the plot 600 presents a complex value of cell impedance at different frequencies of positive pulses, with higher frequencies on the left, and lower frequencies on the right (the highest on the leftmost end of the plot, and the lowest frequency on the rightmost end of the plot). The imaginary part of impedance crossing zero is preferred. The impedance of the battery cell at this point is the overall ohmic resistance of the battery cell. At this point, the Alternating Current (AC part) of the current has a low contribution to the cell reactions. However, the constant current (CC) part leads to Joule heating of the cell, which increases the cell temperature, and therefore, the overall internal resistance of the battery is decreased. Based on the impedance behavior of the cell, optimal heating frequency-OHF (first frequency) at which heating-optimized pulses are applied to the battery cell is determined. In this case, OHF selected for the exemplary cell is 1000 Hz at 50% SOC.

The OHF value (first frequency value) changes with change of the state of charge (SOC) of the battery cell. Therefore, there is a need to perform EIS tests periodically at different SOC stages to identify the OHF. In some cases, OHF identification may not be actively performed, a lookup table which is built during cell characterization can be used. Such a lookup table provides OHF values corresponding to cell state of charge (SOC) and current temperature of the battery cell.

Figure 7:
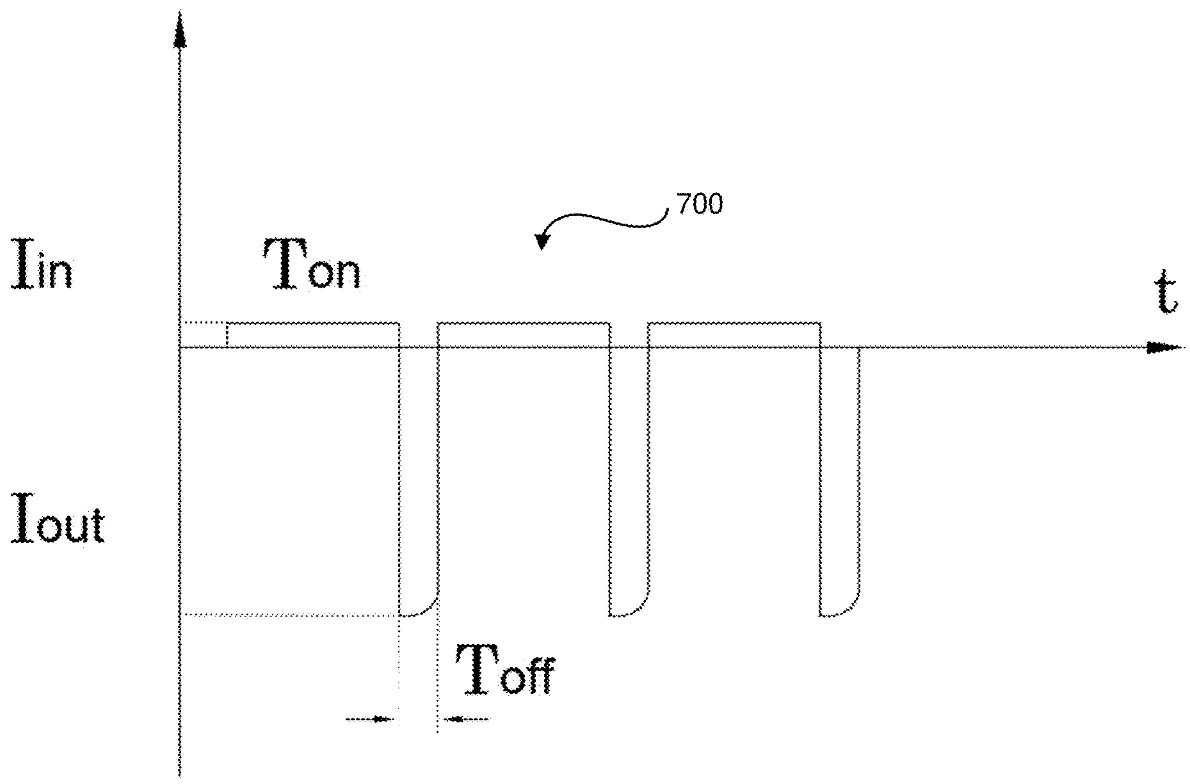
FIG. 7 shows an example pulse after pulse sequence which may be applied for battery charging at low temperature, in accordance with some implementations of the present specification.

FIG. 7 shows an example pulse after pulse sequence 700, which may be applied for battery charging at low temperature. In some implementations, when the temperature of the battery (e.g., battery pack 105) is below a particular level (e.g., −5 Celsius), the battery may be discharged, e.g., the amplitude of the negative pulses may be greater than the amplitude of the positive pulses. The pulse after pulse sequence 700 shows such pulses where the amplitude of the negative pulses is greater than the amplitude of the positive pulses. This would prevent lithium plating that might occur in some areas if charging (higher amplitude of positive pulses than negative pulses) is initiated at the low temperatures. In fact, applying the same amplitude positive pulses and negative pulses in the pulse-after-pulse sequence to the battery may also prove harmful for the battery at low temperatures, therefore discharging the battery with higher amplitude negative pulses (than positive pulses) in the pulse-after-pulse sequence appears to prove beneficial. In some implementations, "active neutral" charging mode may be used to charge the battery at low temperatures.

In some implementations, for positive pulses shown in sequence 700, the value of $I_{IN}$=C/10, where C is capacity of the battery, and for negative pulses shown in sequence 700, the value of $I_{out}$ may depend upon the duty cycle and may reach up to 10 C, for example. In some implementations, when the pulse-after pulse sequences are applied to the battery, the frequency of positive pulses and negative pulses in the sequence 700 may be swept among the set of values. In some implementations, the frequency of the positive pulses and negative pulses in the pulse-after-pulse sequence may be based on Electrochemical Spectroscopy Impedance (EIS) measurements, for example, as described in commonly owned U.S. patent application Ser. No. 15/483,324, the content of which is incorporated herein by reference in its entirety. In some implementations, the frequency of the pulses in the pulse-after pulse sequence 700 may be determined based on EIS measurements, the absolute values of amplitude of the pulses in the pulse-after-pulse sequence may be determined based on the battery temperature, as discussed above, and the difference between the amplitude values of the positive pulse and the negative pulse (e.g., net current supplied to the battery by a pulse sequence) may be determined based on the state of charge (SoC) of the battery and/or state of health of the battery.

Figure 8:
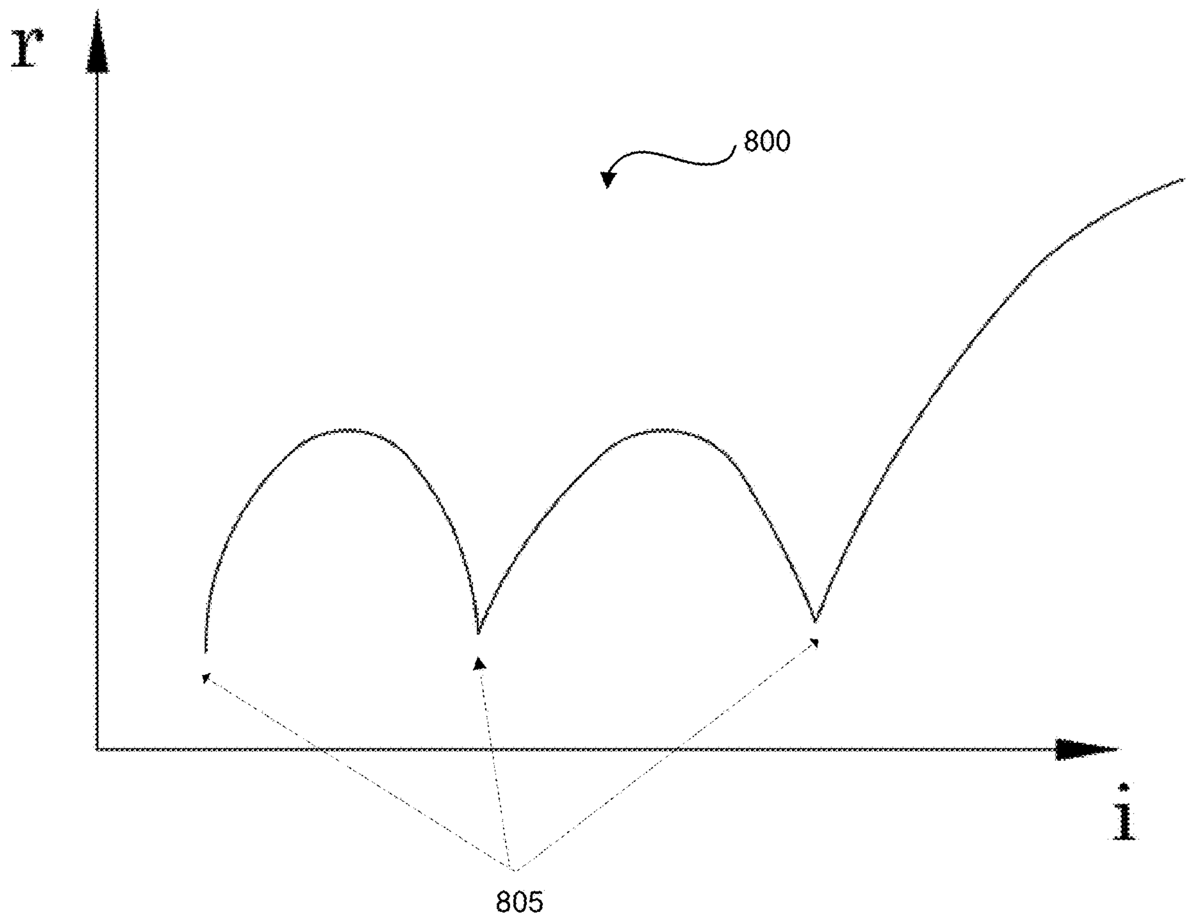
FIG. 8 illustrates an example impedance spectrum of a battery cell, which is depicted as BODE plot, in accordance with some implementations of the present specification.
Figure 9:
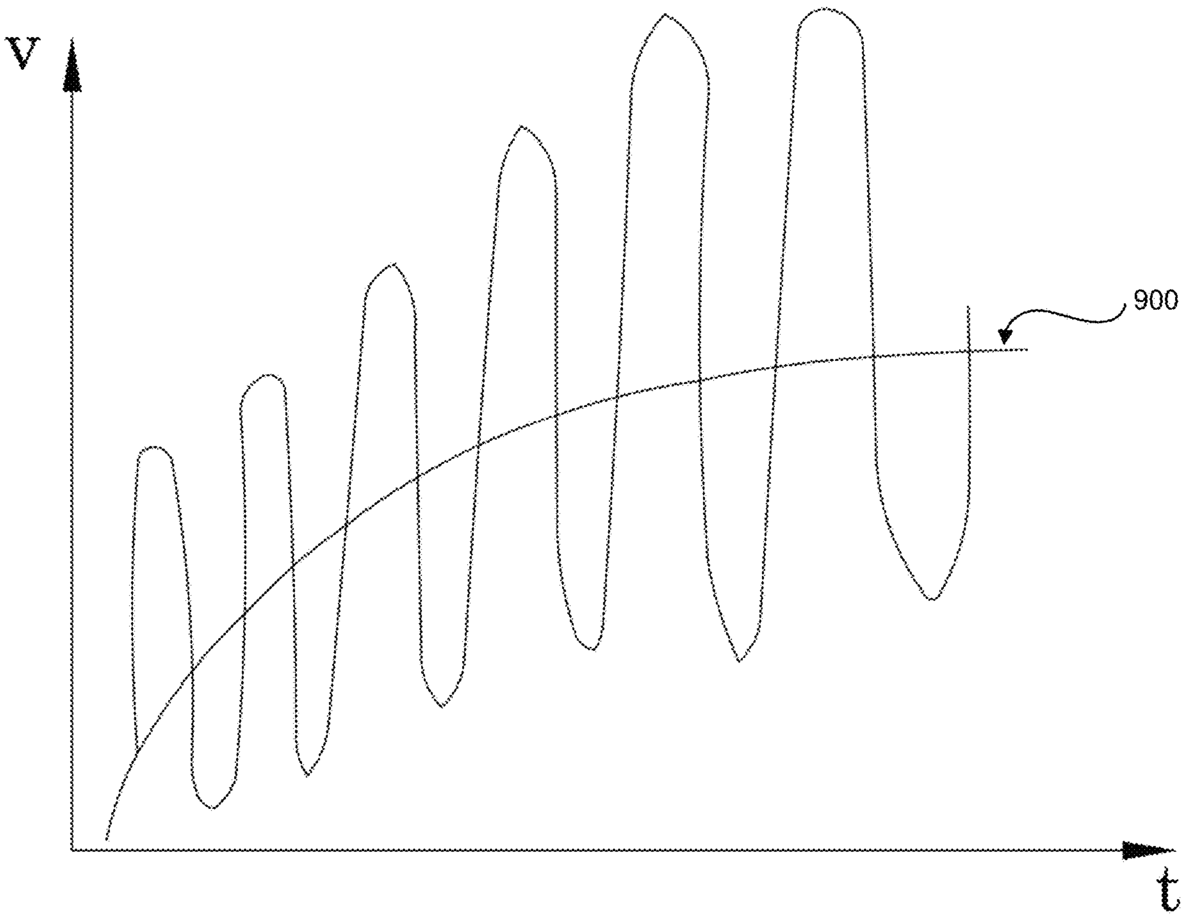
FIG. 9 illustrates another example pulse after pulse sequence which may be applied for battery charging, in accordance with some implementations of the present specification.
Figure 10:
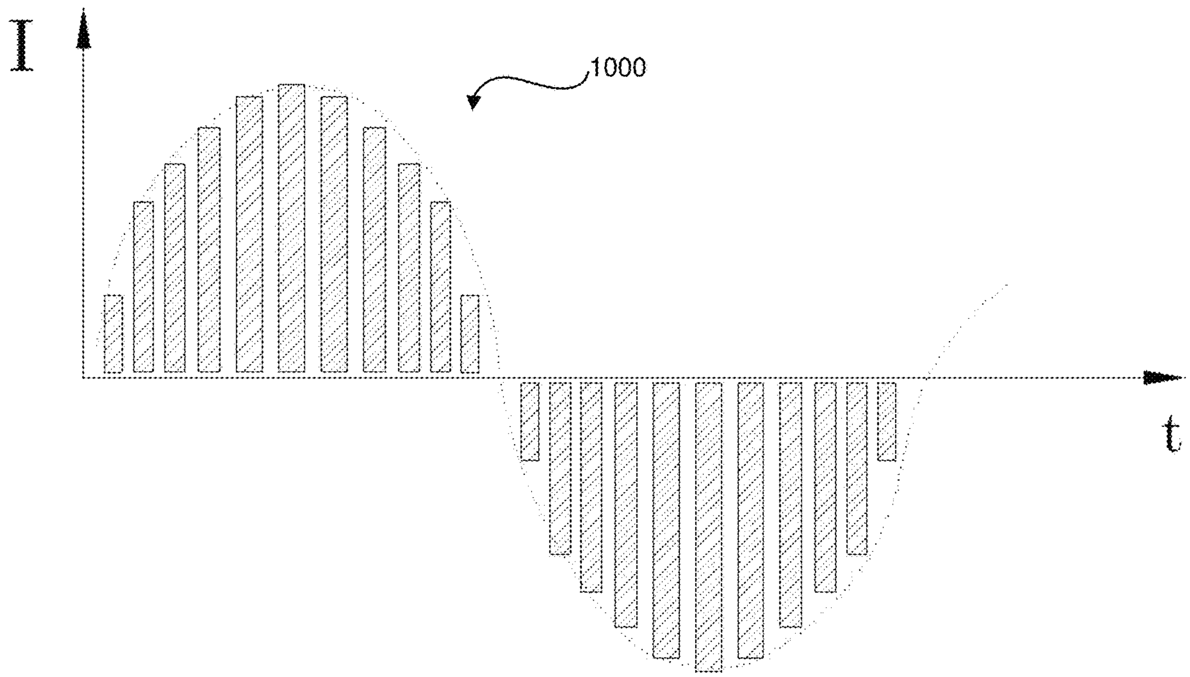
FIG. 10 illustrates an example sinusoidal current waveform consisting of series of high frequency pulses for battery charging, in accordance with some implementations of the present specification.

FIG. 8 illustrates an impedance spectrum of the battery depicted as BODE plot 800, where the inflection points 805 in the spectrum may be identified (in accordance with the methods presented herein), and the frequencies of pulses in the pulse-after-pulse sequence 700 may be selected based on those inflection points 805. In some implementations, the negative pulses in the pulse-after-pulse sequence 700 may not be negative pulses as illustrated in FIG. 9. The positive pulses and the negative pulses of the pulse-after-pulse sequence 700 may be characterized as a sinusoidal wave function (FIG. 9). In some implementations, the sinusoidal current waveform might consist of series of high frequency pulses which build-up overall sinusoidal current waveform. Overall, the usage of sinusoidal current waveform for pulse charging of the battery reduces the electromagnetic interference (EMI) generation, and have better power efficiency. Another example sinusoidal current waveform, consisting of series of high frequency pulses, is depicted in FIG. 10 as waveform 1000. The average effective current for battery charging may follow the CC-CV charging curve recommended by battery manufacturers, which is depicted as curve 900 in FIG. 9.

The use of pulse-after-pulse sequence(s) (e.g., heating-optimized pulses) to control the battery temperature, in accordance with the present disclosure, improves the heat distribution through entire volume of the battery pack inside, which is beneficial over conventional means of controlling the battery temperature. The same techniques based on the temperature controlling pulse sequences are applicable during discharging of the battery too. During discharging of the battery pack during discharge cycle, the amplitude of the pulses might be varied based on the temperature of the battery pack as described above for charging process. The battery charging and discharging methods disclosed herein not only improves the life of the battery but also make it to possible to fast charge the battery without any detrimental effects to the battery health.

It is be noted that the methods disclosed herein are described in terms of being applied to the whole battery pack. However, it is contemplated that the charging methods or protocols described herein may be applied to a portion of the battery pack. For example, if the battery pack comprises different battery modules (each module comprising group of battery cells), different types of pulses may be applied to different modules. For example, the heating-optimized pulses may be applied to one module instead of the whole battery pack depending on the temperature of that module of battery pack. At the same time, the charging-optimized pulses may be applied to another module of the battery pack, if the temperature of the other module is already more than the reference temperature value.

It will be appreciated that the modules, processes, systems, and sections described above can be implemented in hardware, hardware programmed by software, software instructions stored on a non-transitory computer readable medium or a combination of the above. A system and/or a module as described above, for example, can include a processor configured to execute a sequence of programmed instructions stored on a non-transitory computer readable medium. For example, the processor can include, but not be limited to, a personal computer or workstation or other such computing system that includes a processor, microprocessor, microcontroller device, or is comprised of control logic including integrated circuits such as, for example, an Application Specific Integrated Circuit (ASIC). The instructions can be compiled from source code instructions provided in accordance with a programming language such as Java, C, C++, C #.net, assembly or the like. The instructions can also comprise code and data objects provided in accordance with, for example, the Visual Basic™ language, or another structured or object-oriented programming language. The sequence of programmed instructions, or programmable logic device configuration software, and data associated therewith can be stored in a non-transitory computer-readable medium such as a computer memory or storage device which may be any suitable memory apparatus, such as, but not limited to ROM, PROM, EEPROM, RAM, flash memory, disk drive, or the like.

Furthermore, the modules, processes systems, and sections can be implemented as a single processor or as a distributed processor. Further, it should be appreciated that the steps mentioned above may be performed on a single or distributed processor (single and/or multi-core, or cloud computing system). Also, the processes, system components, modules, and sub-modules described in the various figures of and for embodiments above may be distributed across multiple computers or systems or may be co-located in a single processor or system. Example structural embodiment alternatives suitable for implementing the modules, sections, systems, means, or processes described herein are provided below.

The modules, processors or systems described above can be implemented as a programmed general purpose computer, an electronic device programmed with microcode, a hardwired analog logic circuit, software stored on a computer-readable medium or signal, an optical computing device, a networked system of electronic and/or optical devices, a special purpose computing device, an integrated circuit device, a semiconductor chip, and/or a software module or object stored on a computer-readable medium or signal, for example.

Embodiments of the methods and systems (or their subcomponents or modules), may be implemented on a general-purpose computer, a special-purpose computer, a programmed microprocessor or microcontroller and peripheral integrated circuit element, an ASIC or other integrated circuit, a digital signal processor, a hardwired electronic or logic circuit such as a discrete element circuit, a programmed logic circuit such as a PLD, PLA, FPGA, PAL, or the like. In general, any processor capable of implementing the functions or steps described herein can be used to implement embodiments of the method, system, or a computer program product (software program stored on a non-transitory computer readable medium).

Furthermore, embodiments of the disclosed methods, systems, and computer program product (or software instructions stored on a non-transitory computer readable medium) may be readily implemented, fully or partially, in software using, for example, object or object-oriented software development environments that provide portable source code that can be used on a variety of computer platforms. Alternatively, embodiments of the disclosed method, system, and computer program product can be implemented partially or fully in hardware using, for example, standard logic circuits or a VLSI design. Other hardware or software can be used to implement embodiments depending on the speed and/or efficiency requirements of the systems, the particular function, and/or particular software or hardware system, microprocessor, or microcomputer being utilized. Embodiments of the method, system, and computer program product can be implemented in hardware and/or software using any known or later developed systems or structures, devices and/or software by those of ordinary skill in the applicable art from the function description provided herein and with a general basic knowledge of the software engineering and computer networking arts.

Moreover, embodiments of the disclosed methods, systems, and computer readable media (or computer program product) can be implemented in software executed on a programmed general purpose computer, a special purpose computer, a microprocessor, a network server or switch, or the like.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The disclosure is defined solely by the appended claims including any amendments made during the pendency of this application and all equivalents of those claims as issued.

Moreover in this document, relational terms such as first and second, top and bottom, or the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A method to charge a battery pack, the method comprising:

determining a temperature of the battery pack;

comparing the temperature of the battery pack with a reference temperature value;

in response to determining that the temperature of the battery pack is less than the reference temperature value, applying heating-optimized pulses, having a first frequency, to the battery pack, the heating-optimized pulses comprising a sequence of alternating positive and negative pulses, wherein the heating-optimized pulses carry a net positive charge;

concurrent to applying the heating-optimized pulses to the battery pack, determining the temperature of the battery pack; and in response to determining that the temperature of the battery pack is more than the reference temperature value, applying charging current to the battery pack, wherein applying the charging current to the battery pack comprises applying charging-optimized pulses, having a second frequency, to the battery pack, the charging-optimized pulses comprising a sequence of alternating positive and negative pulses, and wherein the charging-optimized pulses carry a net positive charge, and wherein applying the charging current to the battery pack comprises applying charging-optimized pulses, having a second frequency, to the battery pack, the charging-optimized pulses comprising a sequence of alternating positive and negative pulses, and wherein the charging-optimized pulses carry a net positive charge.

2. The method of claim 1, wherein a value of the net positive charge carried by the charging-optimized pulses is same as a value of the net positive charge carried by the heating-optimized pulses.

3. The method of claim 1, wherein a value of the net positive charge carried by the charging-optimized pulses is greater than a value of the net positive charge carried by the heating-optimized pulses.

4. The method of claim 1, further comprising:

prior to comparing the temperature of the battery pack with the reference temperature value:

determining a state of charge (SoC) of the battery pack; and based on the SoC of the battery pack, determining the reference temperature value.

5. The method of claim 1, further comprising:

determining one or more parameters of the charging-optimized pulses based at least on the temperature of the battery pack, wherein the one or more parameters comprise: on duration, amplitude, duty cycle, shape, rest time, frequency, and rate of change of frequency.

6. The method of claim 1, further comprising:

determining a value of one or more of the first frequency and the second frequency based on Electrochemical Impedance Spectroscopy (EIS) measurements corresponding to the battery pack.

7. The method of claim 1, wherein at least one of the heating-optimized pulses, and the charging-optimized pulses comprises sinusoidal pulses.

8. The method of claim 1, wherein applying the charging current to the battery comprises applying constant charging current to the battery pack.

9. A controller to control charging a battery pack, the controller comprising:

at least one processor; and a non-transitory computer-readable storage medium configured to store instructions, wherein the instructions, in response to execution, by the at least one processor, cause the controller to perform or control performance of operations that comprise:

determine a temperature of the battery pack;

compare the temperature of the battery pack with a reference temperature value;

in response to determining that the temperature of the battery pack is less than the reference temperature value, applying heating-optimized pulses, having a first frequency, to the battery pack, the heating-optimized pulses comprising a sequence of alternating positive and negative pulses, wherein the heating-optimized pulses carry a net positive charge;

concurrent to applying the heating-optimized pulses to the battery pack, determine the temperature of the battery pack; and in response to determining that the temperature of the battery pack is more than the reference temperature value, apply charging current to the battery pack, wherein the operation to apply the charging current to the battery comprises an operation to apply charging-optimized pulses, having a second frequency, to the battery pack, the charging-optimized pulses comprising a sequence of alternating positive and negative pulses, and wherein the charging-optimized pulses carry a net positive charge, and wherein an amplitude of positive pulses comprised in the heating-optimized pulses is greater than an amplitude of positive pulses comprised in the charging-optimized pulses, and wherein an amplitude of negative pulses comprised in the heating-optimized pulses is greater than an amplitude of negative pulses comprised in the charging-optimized pulses.

10. The controller of claim 9, wherein a value of the net positive charge carried by the charging-optimized pulses is same as a value of the net positive charge carried by the heating-optimized pulses.

11. The controller of claim 9, wherein a value of the net positive charge carried by the charging-optimized pulses is greater than a value of the net positive charge carried by the heating-optimized pulses.

12. The controller of claim 9, wherein the operations further comprise:

prior to comparing the temperature of the battery pack with the reference temperature value:

determine a state of charge (SoC) of the battery pack; and based on the SoC of the battery pack, determine the reference temperature value.

13. The controller of claim 9, wherein the operations further comprise:

determine one or more parameters of the charging-optimized pulses based at least on the temperature of the battery pack, wherein the one or more parameters comprise: on duration, amplitude, duty cycle, shape, rest time, frequency, and rate of change of frequency.

14. The controller of claim 9, wherein the operations further comprise:

determine a value of one or more of the first frequency and the second frequency based on Electrochemical Impedance Spectroscopy (EIS) measurements corresponding to the battery pack.

15. The controller of claim 9, wherein the controller is implemented in the battery pack.

16. The controller of claim 9, wherein the controller is implemented in a power source that provides power to charge the battery pack.

* * * * *